United States Patent [19]

Russell

[11] 4,160,988
[45] Jul. 10, 1979

[54] INTEGRATED INJECTION LOGIC (I-SQUARED L) WITH DOUBLE-DIFFUSED TYPE INJECTOR

[75] Inventor: Lewis K. Russell, San Jose, Calif.

[73] Assignee: Signetics Corporation, Sunnyvale, Calif.

[21] Appl. No.: 809,615

[22] Filed: Jun. 24, 1977

Related U.S. Application Data

[63] Continuation of Ser. No. 454,789, Mar. 26, 1974, abandoned.

[51] Int. Cl.² ............................................. H01L 27/04
[52] U.S. Cl. ...................................... 357/44; 307/213;
307/296 R; 357/15; 357/35; 357/36; 357/38;
357/46; 357/51; 357/55; 357/60; 357/92;
148/1.5; 357/91
[58] Field of Search ....................... 357/15, 35, 36, 44,
357/46, 92; 307/213, 215, 296 R, 297

[56] References Cited

U.S. PATENT DOCUMENTS

| | | | |
|---|---|---|---|
| 3,328,214 | 6/1967 | Hugle | 357/35 |
| 3,394,037 | 7/1968 | Robinson | 357/48 |
| 3,611,067 | 10/1971 | Oberlin et al. | 357/48 |
| 3,617,827 | 11/1971 | Schmitz et al. | 357/44 |
| 3,631,311 | 12/1971 | Engbert | 357/48 |
| 3,643,235 | 2/1972 | Berger et al. | 357/92 |
| 3,659,160 | 4/1972 | Sloan, Jr. et al. | 357/50 |
| 3,736,477 | 5/1973 | Berger et al. | 357/92 |
| 3,790,817 | 2/1974 | Dobkin | 357/15 |
| 3,823,353 | 7/1974 | Berger et al. | 357/92 |
| 3,922,565 | 11/1975 | Berger et al. | 357/92 |
| 4,056,810 | 11/1977 | Hart et al. | 357/92 |

OTHER PUBLICATIONS

Hibberd, *Integrated Circuits* (McGraw-Hill, N.Y., 1969), pp. 39-41.

*Primary Examiner*—William D. Larkins
*Attorney, Agent, or Firm*—Jerry A. Dinardo; Jack Oisher

[57] ABSTRACT

A semiconductor structure, and method for fabrication, including a semiconductor body of one conductivity type having a major surface. A layer of opposite conductivity material is formed on said surface, said layer having an upper planar surface generally parallel to said major surface. Spaced first and second collector regions are carried by said layer. A third one conductivity region is formed in said layer spaced from said first and second region and extending to an exposed surface of said layer. A fourth region of opposite conductivity type is formed within said third region and extends to an exposed surface of said layer. The layer, third and forth regions form the respective regions of an opposite conductivity—one conductivity—opposite conductivity type source transistor. Additionally, the body, the layer and the first and second regions form the respective regions of a one conductivity—opposite conductivity—one conductivity switching transistor wherein said first and second regions form multiple collectors.

21 Claims, 30 Drawing Figures

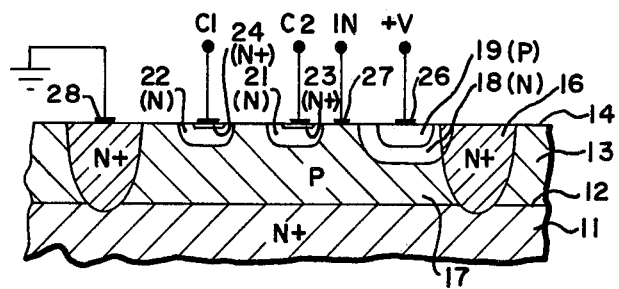
FIG.—1A
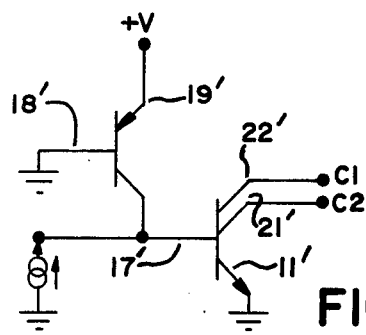
FIG.—1B
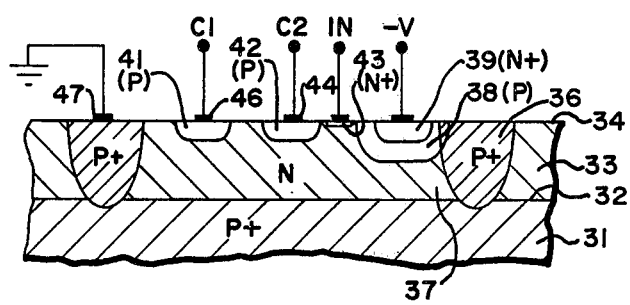
FIG.—2A
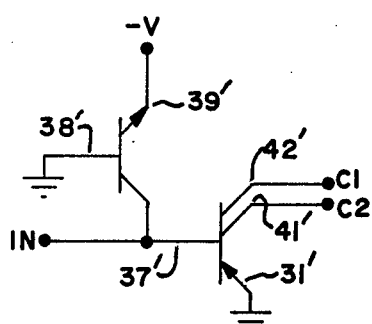
FIG.—2B
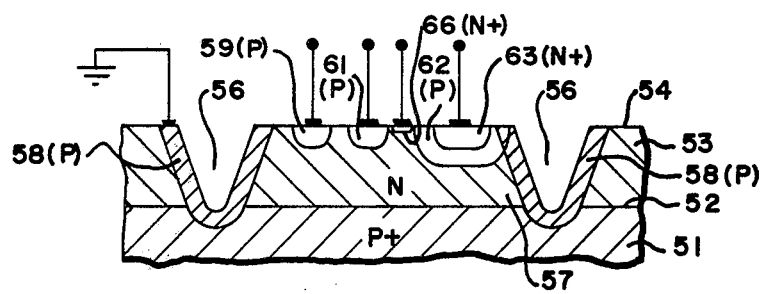
FIG.—3
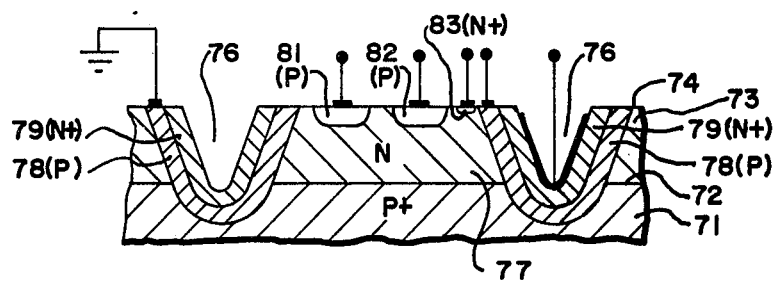
FIG.—3A

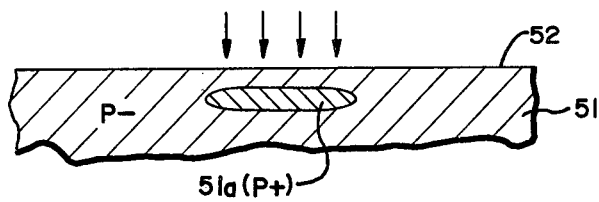
FIG.—4A
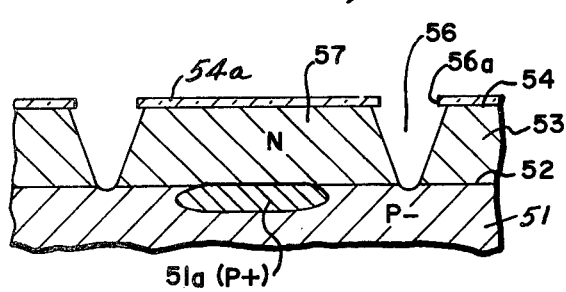
FIG.—4B
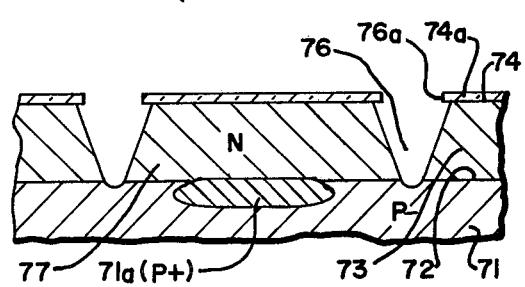
FIG.—4E
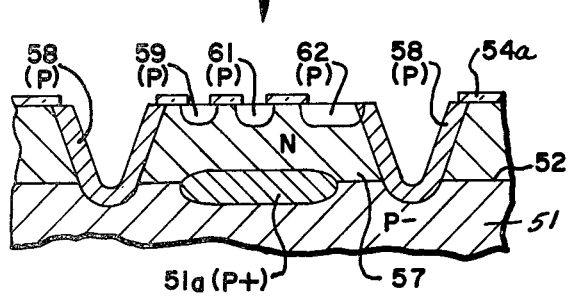
FIG.—4C
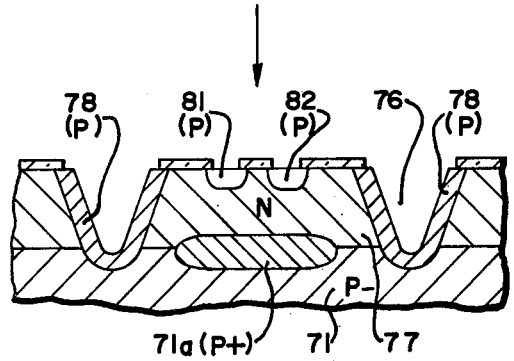
FIG.—4F
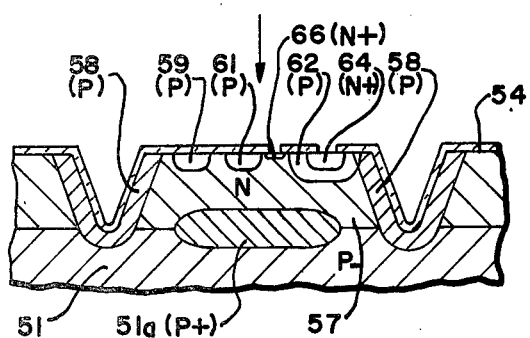
FIG.—4D
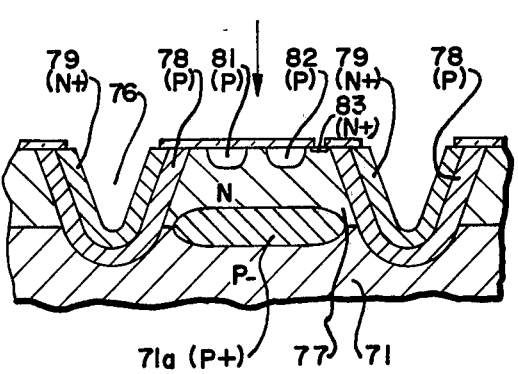
FIG.—4G

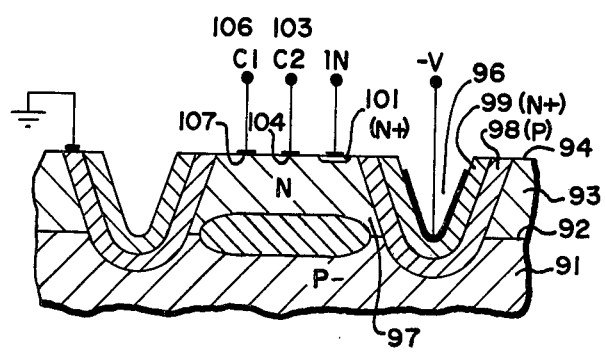
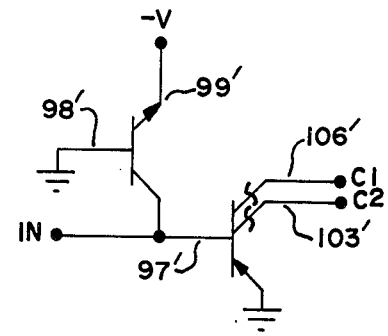
FIG.—5A
FIG.—5B
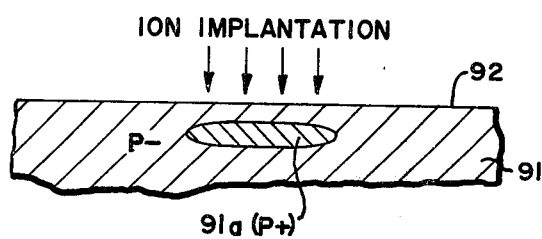
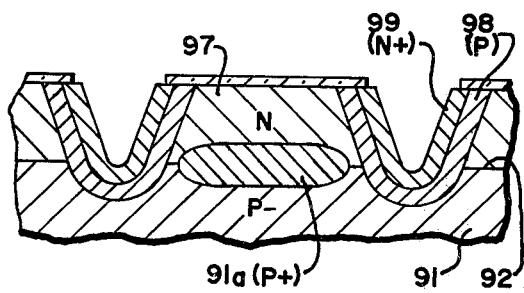
FIG.—5C
FIG.—5F
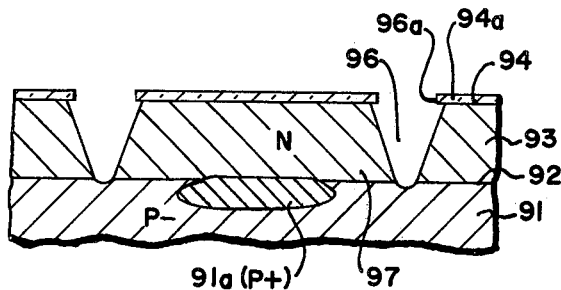
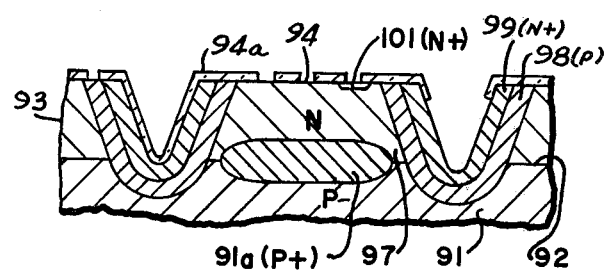
FIG.—5D
FIG.—5G
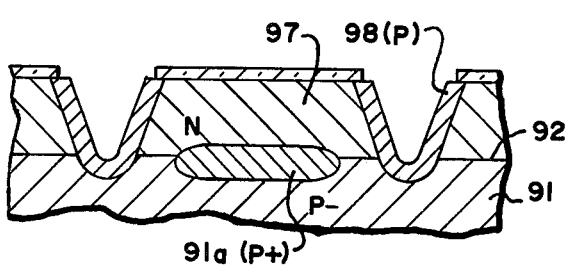
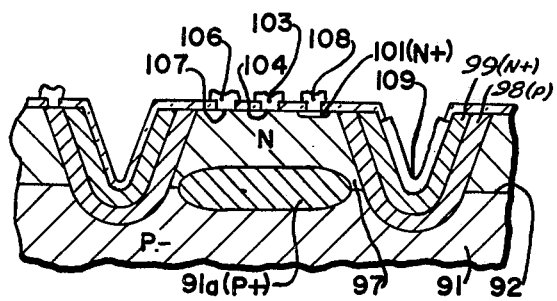
FIG.—5E
FIG.—5H

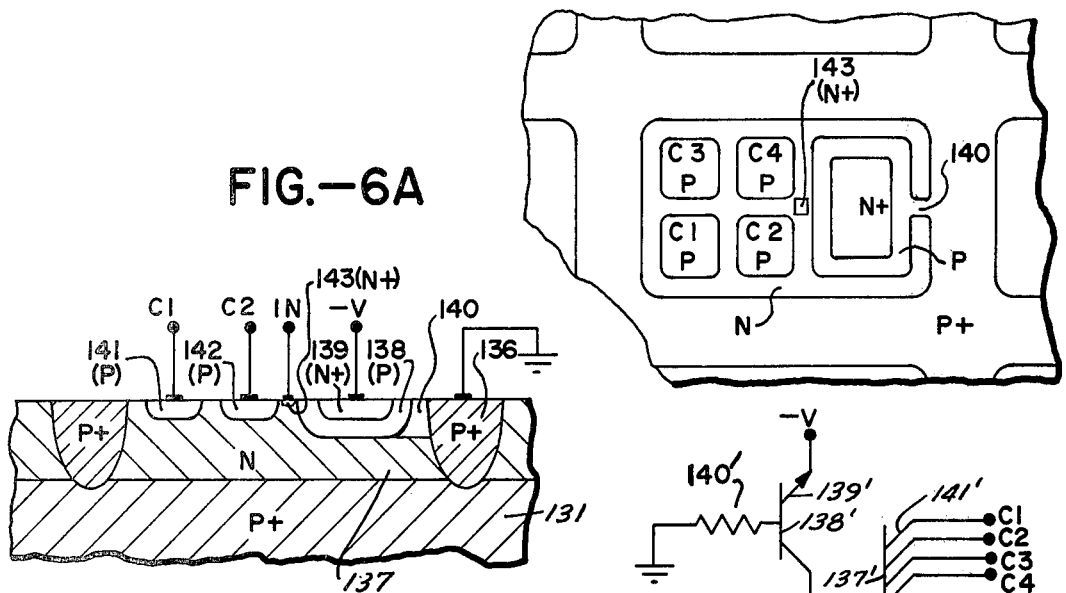
FIG.—6A
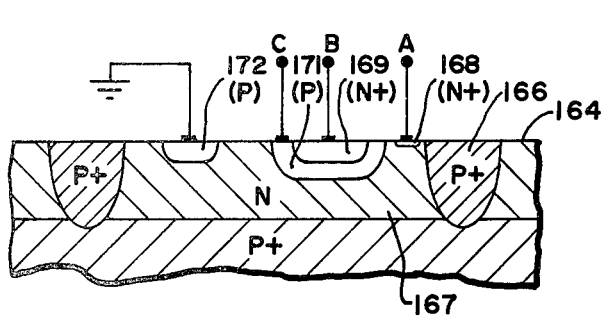
FIG.—6B
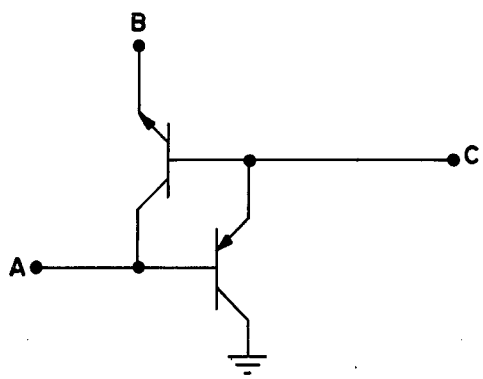
FIG.—6C
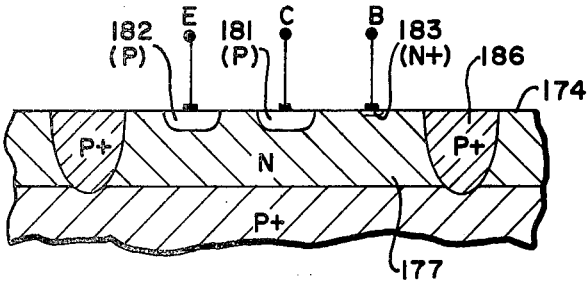
FIG.—7A
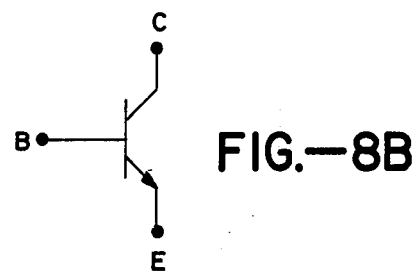
FIG.—7B
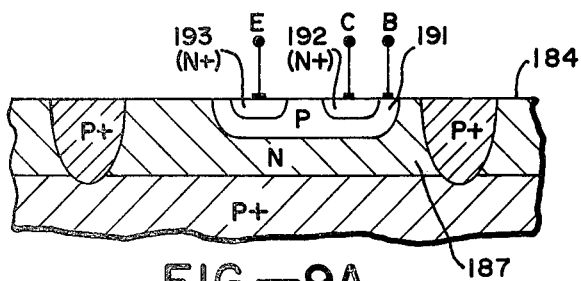
FIG.—8A
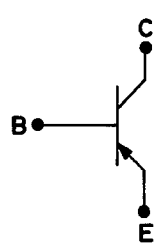
FIG.—8B
FIG.—9A
FIG.—9B

INTEGRATED INJECTION LOGIC (I-SQUARED L) WITH DOUBLE-DIFFUSED TYPE INJECTOR

This is a continuation, of application Ser. No. 454,789 filed Mar. 26, 1974, now abandoned.

BACKGROUND OF THE INVENTION

This invention relates generally to a bipolar semiconductor switching structure and a method for fabrication. More particularly, this invention relates to a bipolar semiconductor switching structure suitable for integrated injection logic circuitry and requiring extremely low operational power requirements.

Although very dense, bipolar transistor integrated injection logic structures have heretofore been provided, such structures have generally provided a low current gain, PNP lateral transistor power source which leaks current and thus consumes power as it is conventionally connected between the voltage means and ground. Thus there is a need for a high performance integrated injection logic structure which operates at reduced power levels.

OBJECTS AND SUMMARY OF THE INVENTION

Accordingly, it is a general object of the present invention to provide an improved performance, integrated injection logic semiconductor structure which operates at reduced power levels.

It is a particular object of the present invention to provide an improved semiconductor injection logic structure which may be formed in relatively high density arrays and which operates at greatly reduced power levels.

The foregoing and other objects of the invention are achieved in a semiconductor strucure, and method for fabrication, including a semiconductor body of one conductivity type having a major surface, and a layer of opposite conductivity material formed on said surface and having an upper planar surface generally parallel to said major surface. Spaced first and second collector regions are carried by said layer. A third one conductivity region is formed in said layer spaced from said first and second regions and extending to an exposed surface of said layer. A fourth region of opposite conductivity type is formed within said third region and extends to the exposed surface of said layer. The layer, the third and fourth regions form the respective regions of an opposite conductivity—one conductivity—opposite conductivity type source transistor. The body, the layer and the first and second regions form the respective regions of a one conductivity—opposite conductivity—one conductivity switching transistor, wherein the first and second regions form multiple collectors.

DESCRIPTION OF THE DRAWINGS

FIG. 1A is a cross-sectional view of a portion of a semiconductor body showing a first embodiment of the collector-up structure. FIG. 1B is the electrical equivalent circuit of FIG. 1A.

FIG. 2A is a cross-sectional view of a portion of a semiconductor body showing an additional embodiment of the collector-up structure. FIG. 2B is the electrical equivalent circuit of FIG. 2A.

FIG. 3 is a cross-sectional view of a portion of a semiconductor body showing an additional collector-up embodiment including V-groove isolation. FIG. 3A is a cross-sectional view of a portion of a semiconductor body showing a collector-up embodiment including a V-groove source transistor and isolation.

FIGS. 4A-G show alternative processing steps for fabricating the devices of FIGS. 3 and 3A.

FIGS. 5A-G show the processing steps in the fabrication of a V-groove semiconductor structure having Schottky contact collector regions.

FIGS. 6A-C show respective top, cross-sectional and equivalent circuit views of an additional embodiment of the FIG. 2 collector-up structure.

FIGS. 7A and 7B are the respective cross-sectional and equivalent circuit views of a four layer device utilizing the collector-up structure.

FIGS. 8A and 8B are the respective cross-sectional and equivalent circuit views of a collector-up P-N-P transistor.

FIGS. 9A and 9B are the respective cross-sectional and equivalent circuit views of an isolated N-P-N collector-up transistor.

DESCRIPTION OF THE PREFERRED EMBODIMENTS

A plurality of semiconductor structures capable of utilizing carrier injection in logic switching operations are shown in the accompanying Figures. Briefly, in general overview, the structures integrate and include a multiple collector switching transistor and a source transistor for providing injected carriers. In contrast to conventional transistors using a portion of the lowermost substrate or body as a collector region, the present invention utilizes the uppermost regions formed in the body as collector regions, hence the designation "collector-up: structures.

As will also be seen, a relatively high gain source transistor is provided, capable of efficiently injecting carriers into the base region of the switching transistor. The source transistor current gain is relatively high as it is configured and may provide betas from 40 to 250. A supply voltage of 0.6–0.8 volts provides logic levels of approximately 0.7 volts and 0.02 volts. Conventional output devices may be used to interface collector-up logic levels with TTL, MOS or CML logic levels.

Referring to FIG. 1A, a first embodiment of the collector-up device is shown. An N+ substrate or body 11 having a major surface 12 has a P type layer 13 formed on surface 12. The P layer 13 has a planar surface 14 which is substantially parallel to surface 12. An N+ isolation ring 16 is formed extending from planar surface 14 through layer 13 to contact surface 12 thereby providing an isolated P region 17. Spaced N type regions 18, 21, and 22 are formed in region 17 and extend to surface 14, with a portion of region 18 overlaping and thus contacting a portion of region 16. A P type region 19 is formed entirely within region 18 and extends to surface 14. N+ contact regions 23 and 24 are formed within the respective regions 21 and 22 and extend to surface 14 to provide contacts to regions 21 and 22. A metal layer formed on surface 14 is patterned to provide metal contacts to exposed portions of regions 26, 27 and 28. Metal contacts are also formed in exposed portions of N+ regions 23 and 24.

FIG. 1B shows the equivalent circuit of the FIG. 1A device with the corresponding prime number indicating the electrical circuit equivalent of the FIG. 1A device element. For example, device body 11 has a corresponding circuit element 11'. Fabrication of the FIG. 1A structure may be by conventional sequential formation of the respective regions in the order as above discussed. Accordingly, the collector-up processing steps to be hereinafter described may be used.

Before discussion of additional collector-up embodiments, the injection logic mechanism may be viewed using the FIGS. 1A-B representative collector-up device. The source P-N-P transistor includes P emitter region 19, N base region 18 and P region 17 utilized as a collector. The associated switching transistor includes N+ body 11 as an emitter, P region 17 as a base (integral with the source transistor collector) and N regions 21 and 22 as multiple collectors.

When a voltage means providing typically 0.6-0.8 V is applied between the +V and ground terminals of the FIGS. 1A-B structure, the structure becomes operational. A relatively small base current between emitter-base regions 19 and 18 provides, by virtue of the source transistor relatively high current gain, a large number of carriers injected into region 17. Although a few carriers may move to emitter region 11, most of the carriers are injected into the base 17 for operation of the switching transistor. In general, the ratio of the carriers which become actively injected into the switching transistor base portion of the region 17 to the few carriers directly injected into emitter 11 approximates the beta of the P-N-P source transistor. That is, for a beta of 100, only 1 carrier is injected into emitter 11 for every 100 carriers actively injected into the base portion of the switching transistor. With this highly efficient source of injected carriers, the switching transistor becomes responsive to logic level inputs (which may be represented as an equivalent additional current source) on the IN line, which is connected to region 17. For configuring a logical AND function the collector contacts 24 (C1), for example, of a number of FIGS. 1A-B structures are connected in parallel to the IN, contact 27 base input of a succeeding similar inverter stage. Each collector region 22 is connected via contact 24 to only one succeeding invertor input and must be capable of sinking its supply current. Therefore, as known in the art, the current gain or beta of the FIGS. 1A-B device must be greater than unity. The speed of the switching transistor is, of course, dependent to some extent on the level of carriers injected into the portion of region 17 employed as the base of the switching transistor.

Conventional lateral P-N-P transistor current sources having betas of only 4-6 may still provide injection operation, but the overall semiconductor structure power efficiency suffers. In the FIGS. 1A-B structure the P-N-P source device current gain is most imperative in determining the power efficiency of the structure. In fact, the speed of the switching transistor may not always be the primary concern in a semiconductor structure design. Rather high source transistor current gain may be required with moderate switching transistor current gain so as to achieve the high power efficiency necessary for extremely low power applications. Thus the present collector-up structure configurations and geometries provide high source transistor betas, such as 40-250, at the expense, if necessary, of switching device speeds to thereby provide high power efficiency in the overall structure.

Referring to FIG. 2A, an additional embodiment of the collector-up semiconductor structure is shown. A P+ substrate or body 31 having a major surface 32 has an N type layer 33 formed on said major surface. Layer 33 has a planar surface 34 substantially parallel to surface 32. A P+ isolation ring 36 extends from surface 34 through layer 33 to contact surface 32 and thereby provide an isolated region 37. Spaced P type regions 38, 41 and 42 are formed in region 37 and extend to surface 34, with a portion of region 38 extending within, overlapping, and thus contacting ring 36. An N+ type region 39 is formed entirely within region 38 and extends to surface 34 and a simultaneously formed N+ contact region 43 is formed in layer 33 and extends to surface 34. A conventional metal layer is then formed on surface 34 and patterned to provide contacts to the respective regions exposed at surface 34.

Similarly, in FIG. 2B the electrical equivalent circuit of FIG. 2A is shown, with the respective prime numbers indicating the circuit element corresponding to the previously described structural elements of FIG. 2A. That is, body 31 has a corresponding circuit element 31' which may represent the emitter of a P-N-P device in FIG. 2B. Fabrication of the FIG. 2A structure may be by conventional sequential formations of the respective regions in the order as above discussed. Accordingly, the collector-up processing steps to be hereinafter described may be used.

Referring to FIG. 3 a semiconductor structure similar to FIG. 2A is shown with V-groove isolation ring 58 corresponding to isolation ring 36 of FIG. 2A. Specifically, P+ substrate or body 51 having a major surface 52 has an N type layer 53 formed thereon having a planar surface 54. Next, a conventional patterned mask, such as a silicon dioxide layer having windows therein, is provided on surface 54 and an anisotropic etch is applied to the surface areas of surface 54 exposed by the mask for a sufficient time to provide a V-groove 56 extending from surface 54 to expose surface 52, thereby providing an isolated region 57. Spaced P type regions 59, 61 and 62 are formed in region 57 extending to surface 54 and simultaneously a P type region 58 is formed in grooves 56 to provide isolation. A portion of P region 62 overlaps P ring 58 at surface 54. N+ region 63 is then formed in region 62 and extends to surface 54. Simultaneously, N+ region 66 is also formed in region 57 and extends to surface 54. As previously discussed, patterned metal contacts are then formed to the respective regions as they are exposed in surface 54. Again, the FIG. 3 structure may be sequentially formed using the processing steps in the order above described. Of course, a structure similar to the FIG. 1A structure, may likewise be formed by substituting P type impurities for N type impurities with N+ contact regions being required to provide contacts to the N regions. Specific processing steps will be hereinafter described in conjunction with FIG. 4.

Referring to FIG. 3A an additional embodiment of the present invention is shown. A P+ semiconductor substrate or body 71 having a major surface 72 has an N layer 73 formed on said major surface. Layer 73 has a planar surface 74 substantially parallel to surface 72. V-groove isolation 76 is formed such as by an isotropic selective etching of planar surface 74. V-grooves 76 extend from surface 74 through layer 73 and contact body 71 at major surface 72, thereby providing an isolated N type region 77. As will be presently seen a P type, V-shaped region 78 is formed in the walls of the V-grooves 76, and an N+ type region 79 is formed entirely within region 78 extending to the exposed walls of grooves 76. Spaced P type regions 81 and 82 are formed in region 77 and extend to surface 74. N+ contact region 83 is formed simultaneously with N+ region 79. Metal contacts are then provided to contact the respective regions at the exposed surface 74 and also contacting N+ region 79.

Turning to fabrication, the FIGS. 3 and 3A devices may be fabricated as shown in FIGS. 4A-G. Conventional formation of the lightly doped N type epitaxial layer on the heavily doped P+ substrate or body previously shown (FIGS. 1A and 2A) provides only a low doping gradient at the substrate or body interface with the epitaxial layer. This is caused by out diffusion of impurities from the P+ substrate and auto doping of the gas conventionally used in the epitaxial layer. In FIG. 4A, however, an additional processing step is shown, wherein acceptor ions, here P conductivity determining impurities, are implanted heavily beneath the surface and within a lightly P doped substrate or body. As will be seen, the implanted region will migrate to form an abrupt junction having a high doping gradient and thus provide a device exhibiting excellent hole injection and P-N-P emitter efficiency. Starting with a P-substrate or body 51 having a major surface 52 an ion implantation is made in surface 52 to form a P+ region 51a within body 51 adjacent surface 52. Region 51a may be approximately ½ micrometer from surface 52. This processing step is included to provide high emitter efficiency in the structure, and may be omitted if the body or substrate 51 alone is a sufficient emitter or source for a particular application.

Next, referring to FIGS. 4B an N type layer 53 is formed on surface 52, such as by the conventional epitaxial process, said layer having a planar surface 54 substantially parallel to major surface 52. Next, a masking layer 54a such as silicon dioxide, is formed on surface 54 and windows 56a are open to exposed portions of upper surface 54. Next, an anisotropic etch is applied through said windows for sufficient time to form V-grooves 56 extending from surface 54 through layer 53 with the apex of the "V" contacting surface 52 and extending within body 51. The slope of the V-groove side walls may be conventionally determined by the anisotropic etch used and may be approximately 70° with respect to planar surface 54.

Apertures are formed in mask layer 54a to expose portions of the upper surface 54. P type conductivity determining impurities are then formed in the exposed areas of surface 54, to form P type isolation ring 58 and spaced P region 59, 61 and 62 in surface 54 with region 62 overlapping and thus contacting ring 58. It should be noted that P+ region 51a by virtue of previous high temperature processing steps has migrated through surface 52.

Referring to FIG. 4D, a conventional masking step is performed to expose a portion of the upper surface of region 62. Next, an N+ region 64 is formed through the conventional mask, entirely within P type region 62 and extending to surface 54. At this point it must be noted that P+ region 51a has migrated to the junction between the N isolated region 57 and the substrate or body 51 as a result of the high temperature processing step. Next, the masking layer is removed and referring to FIG. 3, N+ region 66 is formed in the exposed surface 54 of region 57. Metal contacts are then formed in surface 54 contacting the exposed upper surface of the respective regions of the collector-up device.

The structure shown in FIG. 3A may be fabricated using the processing steps shown in FIGS. 4A, and 4E-G. The ion implantation process step previously described in conjunction with FIG. 4A may again be used. A P- semiconductor substrate or body 71 having a major surface 72 has P+ conductivity determining impurities formed by ion implantation in surface 72 forming a P+ region 71a within body 71 and adjacent surface 72. Next, an N type layer 73 is formed on a major surface 72, such as by conventional epitaxial process, layer 73 having planar surface 74 substantially parallel to surface 72.

By conventional masking steps, a masking layer 74a is formed on surface 74 and has apertures 76a formed therein to expose portions of the surface 74. Next, an anisotropic etch is applied to the exposed surfaces for a sufficient time to etch V-groove 76 extending from surface 74 through layer 73 to surface 72 and within substrate or body 71, thereby providing an isolated N type region 77. Again the etching process may provide V-groove walls having a slope of approximately 70° with respect to surface 74 and surface 72 and within substrate or body 71. The etching process provides V-groove walls wherein the apex of the V extends within body 71.

Next, with reference to FIG. 4F, an additional conventional masking step exposes the V-groove 76 and portions of surface 74 so that P type regions 81 and 82 may be formed in isolated region 77 extending to surface 74. Simultaneously, the P type isolation regions 78 are formed in the exposed walls of the V-groove 76. Again it must be noted that the P+ region 71a as a result of the high temperature processing steps has migrated through the junction of N region 77 and P body 71.

Next, in an additional masking step, N+ type regions 79 are formed such as by subsequent diffusion, in the walls of the V-groove 76, as shown in FIG. 4G. Region 71a has now migrated past the junction between region 77 and body 71. Referring to FIG. 3A, N+ contact region 83 is formed in the exposed surface 74 at the same time as are the N+ regions 79. Next, metal contacts are provided to contact the exposed respective regions at surface 74 and to contact the N+ region 79.

Referring to FIG. 5A a semiconductor structure having Schottky contact collectors is shown having an equivalent circuit as shown in FIG. 5B. A P- substrate or body 91 having a major surface 92 has an N type layer 93 formed on said surface. Layer 93 has a planar surface 94 substantially parallel to surface 92. A V-groove 96 isolation ring is provided extending from surface 94 through layer 93 with the apex of the V-groove extending through surface 92 and within the body 91 to form an isolated N type region 97. A P type region 98 is formed in the exposed walls of the groove 96 and an N type region 99 is formed entirely within region 98 and extending to the exposed walls of the groove. At the same time an N+ contact region 101 is formed within isolated region 97 and extends to surface 94. Spaced Schottky metal contacts are carried by region 97 to provide Schottky contact collectors. Schottky region 104 and 107 may be formed in operation at the respective interfaces 104 and 107 between the metal contacts 103 and 106 and with surface 94.

Turning now to fabrication of the Schottky embodiment, the processing steps are shown in FIGS. 5C-5H. Referring to FIG. 5C, the buried P+ region for higher emitter efficiency may be used in combination with the Schottky device and is formed by ion implantation of P+ conductivity determining impurities in P- body 91 adjacent a major surface 92 of said body. Next, referring to FIG. 5D, an N type layer 93 is formed on the major surface 92 and has a planar surface 94 substantially parallel to surface 92. Next, a conventional masking step is performed such as by forming a silicon dioxide layer 94a on surface 94 and opening windows 96a in said layer to expose portions of surface 94. Next, an anisotropic etch is applied to the exposed surface 94 for a sufficient time to cause the etch to form ring-like V-groove 96 extending from surface 94 through layer 93 wherein the apex of the V-groove extends through surface 92 and into body 91 to form an isolated region 97.

Next, and with reference to FIG. 5E, P conductivity determining impurities may be formed in the exposed walls of the V-groove 96 to form region P type 98. It should be noted that the same mask step as that used for etching may be used, or alternatively, the etching mask may be stripped and a new mask formed on surface 94 before the formation of region 98. It is important to note at this point that region 91a, by virtue of the high temperature processing steps, has continued to migrate and has penetrated through surface 92 which forms the junction between region 97 and body 91. Referring to FIG. 5F, an N+ type region 99 is formed within P region 98 and extending to the exposed walls of the V-groove. This region may be formed by subsequent diffusion using the same mask as previously used to form region 98. Again region 91a has, during this high temperature processing step moved to form the junction between region 97 and body 91.

At the same time as region 99 is formed a window is formed in the masking layer 94a and the N+ impurity is diffused into the N body 97 to form the region 101 extending to the surface 94. Next, with reference to FIG. 5H spaced windows may be provided in a masking or passivation layer for spaced Schottky metal to semiconductor contacts 103 and 106, contacting the region 97 at interface 104 and interface 107. Simultaneously, metal contacts 108 and 109 may be formed to contact N+ regions 101 and 99 respectively.

Referring to FIGS. 6A–C, a further embodiment of the FIG. 2A structure is shown. However, in FIGS. 6A–C, P region 138 is spaced from P+ isolation region 136 and resistive region 140 extends between region 138 and region 136. The effect of increased base resistance in combination with the relatively high gain source transistor is to further decrease power consumption and reduce the leakage path through the source transistor which in the structure of FIG. 6B provides highly efficient carrier injection in the associated multi-collector switching transistor. Additional collectors may also be provided as shown in FIG. 6A.

FIGS. 7A and 7B show the structure and equivalent circuit respectively of a four layer device which may be used as a silicon-controlled rectifier (SCR). Isolation walls 166 as provided in FIG. 2A, or V-groove isolation may be used and spaced P type regions 171 and 172 may be formed in isolation region 167 and extend to surface 164. Next, an N+ region 169 is formed within P type region 171 and extends to surface 164. An N+ region 168 is simultaneously formed within region 167 and extends to surface 164. Metal contacts then provide contact means to connect the structure to external circuitry. The contact to region 167 provides a gate for the controlled rectifier device.

Referring to FIGS. 8A and 8B an isolated collector-up N-P-N device is shown in conjunction with the previously discussed isolation and comprises spaced P type regions 181 and 182 formed in isolated region 177 and extending to surface 174. Regions 181 and 182 may be symmetrically disposed within region 177 and either region 181 or 182 may be used as emitter or collector as desired. A contact N+ region 183 is formed in region 177 and extends to surface 174 to provide a base contact to complete the bipolar device.

Referring to FIGS. 9A and 9B, an isolated P-N-P device is shown. The previously discussed isolation means and an N type layer are combined. A P type region 191 formed within region 187 extending to surface 184 to form the base region of the device. Spaced N+ regions 192 and 193 are formed entirely within region 191 and extend to surface 184. Again region 192 and 193 may be symmetrically disposed within region 191 to thereby provide a device wherein either region 192 or 193 may be used as emitter or collector of the device as desired. Contacts are then formed in the exposed surface of the respective regions to complete the bipolar device.

Thus it is apparent that there has been provided an improved performance collector-up family of semiconductor structures which may be used for integrated injection logic circuitry operating at reduced power levels. In particular, the present invention provides a collector-up family of semiconductor structures particularly useful for logic circuitry in relatively high density arrays capable of being operated at relatively high speeds and at greatly reduced power levels.

I claim:

1. In a semiconductor structure, a semiconductor body of one conductivity type having a major surface, a layer of opposite conductivity formed on said major surface and having an upper planar surface generally parallel to said major surface, spaced first and second collector regions in rectifying contact with said layer and extending to said planar surface, said first and second collector regions spaced from said body, a third one conductivity region formed in said layer spaced from said first and second regions and extending to said planar surface of said layer, a fourth region of opposite conductivity type formed within said third region and extending to said planar surface of said layer, whereby said layer, said third and fourth regions form the respective regions of an opposite conductivity—one conductivity—opposite conductivity type source transistor, and said body, said layer and said first and second regions form the respective regions of a one conductivity—opposite conductivity—one conductivity switching transistor wherein said first and second regions form multiple collectors, lead means for connecting said regions to external circuitry, a one conductivity isolation ring which extends from said planar surface through said layer to contact said body and surround a portion of said layer to thereby define and isolate the semiconductor structure, said isolation ring having a V groove formed therein having downwardly and inwardly tapering walls with respect to said planar surface and wherein the apex of said V extends substantially to the body, and wherein the exposed walls of said V groove have a one conductivity region formed therein.

2. In a semiconductor structure, a semiconductor body of one conductivity type having a major surface, a layer of opposite conductivity formed on said major surface and having an upper planar surface, spaced first and second collector regions in rectifying contact with said layer and extending to said planar surface, said first and second collector regions spaced from said body, a third one conductivity region formed in said layer spaced from said first and second regions and extending to said planar surface of said layer, a fourth region of opposite conductivity type formed within said third region and extending to said planar surface of said layer, whereby said layer, said third and said fourth regions form the respective regions of an opposite conductivity—one conductivity—opposite conductivity type source transistor, and said body, said layer and said first and second regions form the respective regions of a one conductivity—opposite conductivity—one conductivity switching transistor wherein said first and second regions form multiple collectors, lead means for connecting said regions to external circuitry together with a one conductivity isolating ring which extends from said planar surface through said layer to contact said body and surround a portion of said layer to thereby define and isolate the semiconductor structure and wherein said third region and said isolation ring are interconnected by structural means integrated with said layer for providing a reduced supply voltage between said third region and said isolation ring, said structural means constituting the sole connection to said third region of the source transistor.

3. A semiconductor structure as in claim 2 wherein said means for providing a reduced supply voltage comprises an additional resistive region having a differing resistivity from and formed in said layer, said third region and said isolation ring being interconnected by said additional resistive region to provide an increased resistance along a path between said third region and isolation ring.

4. In a semiconductor structure, a semiconductor body of one conductivity type having a major surface, a layer of opposite conductivity formed on said major surface and having an upper planar surface, spaced first and second collector regions in rectifying contact with said layer and extending to said planar surface, said first and second collector regions spaced from said body, a third one conductivity region formed in said layer spaced from said first and second regions and extending to said planar surface of said layer, a fourth region of opposite conductivity type formed within said third region and extending to said planar surface of said layer, whereby said layer, said third and said fourth regions form the respective regions of an opposite conductivity—one conductivity—opposite conductivity type source transistor, and said body, said layer and said first and second regions form the respective regions of a one conductivity—opposite conductivity—one conductivity switching transistor wherein said first and second regions form multiple collectors, lead means for connecting said regions to external circuitry together with a one conductivity isolation ring which extends from said planar surface through said layer to contact said substrate and surround a portion of said layer to thereby define and isolate the semiconductor structure and wherein said third region and said isolation ring are interconnected by structural means integrated with said layer for providing a reduced supply voltage between said third region and said isolation ring, said structural means including a necked down portion of said third region extending to connect said third region to said isolation ring to thereby define an additional resistive region formed in said layer.

5. In a semiconductor structure, a semiconductor body of one conductivity type having a major surface, a layer of opposite conductivity formed on said surface and having an upper planar surface generally parallel to said major surface, spaced first and second collector regions in rectifying contact with said layer and extending to said upper planar surface, said first and second collector regions spaced from said body, a third one conductivity region formed in said layer spaced from said first and second regions and extending to said planar surface of said layer, a fourth region of opposite conductivity type formed within said third region and extending to said planar surface of said layer, whereby said layer, said third and said fourth regions form the respective regions of an opposite conductivity—one conductivity—opposite conductivity type source transistor, and said body, said layer and said first and second regions form the respective regions of a one conductivity—opposite conductivity—one conductivity switching transistor wherein said first and second regions form multiple collectors, lead means for connecting said regions to external circuitry, and wherein a V groove extends from said planar surface substantially through said layer to said body, said groove having downwardly, inwardly tapering walls with respect to said planar surface, and wherein said third region is a one conductivity region formed in the exposed walls of said groove and wherein said fourth region is an opposite conductivity region formed within said third region and extending to an exposed wall of said groove.

6. A semiconductor structure as in claim 5 wherein said lead means provides ohmic contacts in said respective regions and wherein said first and second regions are formed within said layer and extend to said planar surface.

7. A semiconductor structure as in claim 6 wherein said one conductivity regions are N type regions and wherein said opposite conductivity regions are P type regions.

8. A semiconductor structure as in claim 6 wherein said one conductivity regions are P type regions and wherein said opposite conductivity regions are N type regions.

9. A semiconductor structure as in claim 5 together with Schottky metal contacts to said first and second regions and ohmic contacts to the respective third and fourth regions, said layer and said substrate.

10. A semiconductor structure as in claim 9 wherein said one conductivity regions are N type regions and wherein said opposite conductivity regions are P type regions.

11. A semiconductor structure as in claim 8 wherein said one conductivity regions are P type regions and wherein said opposite conductivity regions are N type regions.

12. In a semiconductor structure, a semiconductor body having a planar surface and including a body portion of one conductivity type, a first region of opposite conductivity type formed in said body and extending to said surface, spaced second and third collector regions in rectifying contact with said first region and extending to said surface, said second and third collector regions spaced from said body portion, a fourth region of one conductivity type formed within said first region, said fourth region being spaced from said second and third regions and extending to said planar surface, and a fifth region of opposite conductivity type formed entirely within said fourth region and extending to said surface, lead means for coupling said regions and said body portion to external circuitry and wherein said fourth region and said body portion are interconnected by structural means integrated with said semiconductor body for providing a reduced supply voltage between said fourth region and said body portion, said structural means constituting the sole connection to said fourth region.

13. A semiconductor structure as in claim 12 wherein said one conductivity regions are N type regions and said opposite conductivity regions are P type regions.

14. A semiconductor structure as in claim 12 wherein said one conductivity regions are P type regions and said opposite conductivity regions are N type regions.

15. A semiconductor structure as in claim 12 together with Schottky metal contacts to said second and third regions and ohmic contacts to the respective first, fourth and fifth regions, and to said body.

16. A semiconductor structure as in claim 12 wherein said means for providing a reduced supply voltage comprises an additional resistive region having a differing resistivity from and formed in said first region, said fourth region and said body portion being interconnected by said additional resistive region to provide an increased resistance along a path between said fourth region and said body portion.

17. In a semiconductor structure, a semiconductor body having a planar surface and including a body portion of one conductivity type, a first region of opposite conductivity type formed in said body and extending to said surface, spaced second and third collector regions in rectifying contact with said first region and extending to said surface, said second and third collector regions spaced from said body portion, a fourth region of one conductivity type formed within said first region, said fourth region being spaced from said second and third regions and extending to said planar surface, and a fifth region of opposite conductivity type formed entirely within said fourth region and extending to said surface, lead means for coupling said regions and said body portion to external circuitry and wherein said fourth region and said body portion are interconnected by structural means integrated with said semiconductor body for providing a reduced supply voltage between said fourth region and said body portion, said structural means including a necked down portion of said fourth region extending to said body to thereby define an additional resistive region formed in said body.

18. In a semiconductor structure, a semiconductor body having a planar surface comprising a body portion of one conductivity type, a first region of opposite conductivity type formed in said body and extending to said surface, spaced second and third collector regions in rectifying contact with said first region and extending to said surface, said second and third collector regions being spaced from said body portion, source means for providing current connected to said first region, said source means comprising a source transistor which has a base region of said one conductivity type and emitter and collector regions of the opposite conductivity type, said source transistor regions extending in the semiconductor body, said collector region of the source transistor extending to said surface and being connected to said first region, lead means for coupling said regions and said body portion to other circuitry and wherein said source transistor base region and said body portion are interconnected by structural means integrated with the semiconductor body for providing a voltage difference between said base region and said body portion, said structural means constituting the sole connection to the base region of said source transistor.

19. A structure as in claim 18 wherein said means for providing a supply voltage difference between said base region and said body portion is utilized in order to reduce power consumption.

20. A structure as in claim 18 wherein said means for providing a supply voltage difference between said base region and said body portion comprises a resistive portion of the semiconductor body.

21. The invention according to claim 18 wherein said semiconductor structure includes at least two intercoupled gate circuits each of which includes said source transistor and a switching transistor, said switching transistor having an emitter constituted by said body portion, a base constituted by said first region, and plural collectors constituted by said second and third collector regions, at least one of the plural collectors of the switching transistor in the output of one of said gate circuits being connected to a collector region of the source transistor in the input of the other one of said gate circuits.

* * * * *